United States Patent [19]

Choi et al.

[11] Patent Number: 5,616,025

[45] Date of Patent: Apr. 1, 1997

[54] VERTICAL DIFFUSION FURNACE HAVING IMPROVED GAS FLOW

[75] Inventors: Sang-kook Choi, Suwon; Chung-hwan Kwon, Yongin-gun; Hong-keun Kim, Suwon, all of Rep. of Korea

[73] Assignee: Samsung Electronics Co., Ltd., Suwon, Rep. of Korea

[21] Appl. No.: 558,398

[22] Filed: Nov. 16, 1995

[30] Foreign Application Priority Data

Jul. 11, 1995 [KR] Rep. of Korea ............ 95-20391

[51] Int. Cl.$^6$ ................................................. F27D 3/12
[52] U.S. Cl. ................................. 432/241; 432/152
[58] Field of Search ............................... 432/152, 241

[56] References Cited

U.S. PATENT DOCUMENTS

| | | | |
|---|---|---|---|
| 4,790,750 | 12/1988 | Bourel et al. | 432/241 |
| 5,330,352 | 7/1994 | Watanabe et al. | 432/241 |
| 5,445,521 | 8/1995 | Yamaguchi et al. | 432/241 |

*Primary Examiner*—Noah P. Kamen

[57] ABSTRACT

A vertical diffusion furnace comprising; a quartz tube, a plurality of wafers loaded into the quartz tube, and a gas inlet formed in the quartz tube proximate a lowermost wafer in the plurality of wafers, and providing reactive gases into the quartz tube.

5 Claims, 3 Drawing Sheets

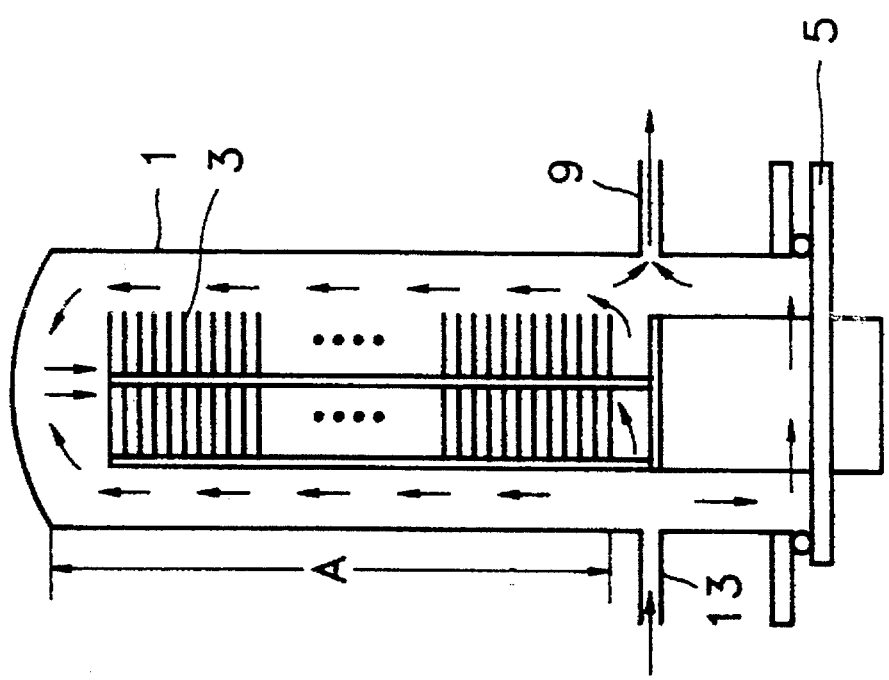

VERTICAL DIFFUSION FURNACE HAVING IMPROVED GAS FLOW

BACKGROUND OF THE INVENTION

The present invention relates to a vertical diffusion furnace, and more particularly to a vertical diffusion furnace having improved flow of hydrogen gas.

Vertical diffusion furnaces are rapidly becoming the furnace of choice in many technology areas including the manufacture of semiconductor devices. In contrast with a conventional horizontal diffusion furnace, the vertical diffusion furnace has several major advantages. For example, in furnace applications directed to the fabrication of semiconductor devices, no cantilever or soft-landing is required since silicon wafers are held in a quartz boat which does not touch the process tube walls. Vertical diffusion furnaces allow automatic loading and unloading of wafers. Finally, vertical diffusion furnaces create less of a floor space footprint in the clean room.

One problem which must be addressed in any diffusion furnace application directed to semiconductor fabrication processes is the presence of electrical charge on the boundary region of a silicon substrate and/or an oxide layer formed thereon. Such "unbounded" or stray electrical charge result in degraded performance characteristics for the semiconductor device, such as increased contact resistance in wiring or increased leakage current. In order to solve the problem of stray electrical charge, hydrogen gas is used during alloy processes in the conventional vertical diffusion furnace. The hydrogen gas, which enters the vertical diffusion furnace at normal temperature, rapidly heats in the high temperature environment of the furnace. The energy absorbed during the heating process causes the hydrogen gas to shed hydrogen ions. Hydrogen ions react with uncombined electrical charge present on the boundary region of the wafers and/or one of the intermediate layers disposed thereon to eliminate the stray charge.

FIGS. 1A and 1B show a conventional vertical diffusion furnace. Within the drawings referenced in this application, like reference numerals indicate like elements.

Referring to FIGS. 1A and 1B, the conventional vertical diffusion furnace includes a gas injector through which hydrogen gas is injected into the interior reaction environment of the vertical diffusion furnace together with nitrogen gas. More particularly, the conventional vertical diffusion furnace comprises; a quartz tube 1 forming the interior reaction environment, a plurality of wafers 3 vertically loaded into quartz tube 1, a support 5 supporting loaded wafers 3, and a gas outlet 9 discharges the gas from quartz tube 1 following reaction.

Additionally in FIG. 1A, a gas injector 11 is vertically disposed along the outer wall of quartz tube 1. Hydrogen gas and nitrogen gas are injected into the vertical diffusion furnace through a connector placed in the top of the vertical diffusion furnace. Alternately, as shown in FIG. 1B, a gas injector 11a is vertically installed along the inner wall of quartz tube 1. In both conventional embodiments, hydrogen gas is injected into the quartz tube through gas injectors (11, 11a) together with nitrogen gas. The injected hydrogen gas flows from the upper portion of the quartz tube, over the upwardly loaded wafers, and down to the lower wafers.

Typically, the temperature of the vertical diffusion furnace is about 400° C., and the temperature of the injected hydrogen and nitrogen gases is much lower. This temperature difference causes the injected gases to flow downward within the quartz tube. Additionally, the hydrogen gas and nitrogen gas flow downward in response to gravity. The combined downward thrust of the injected gases generates significant convection throughout the vertical diffusion furnace. The swirling effect of convection on the injected gases inhibits the reaction between the hydrogen gas ions and the loaded wafers. As the result, desired affect of the hydrogen gas, i.e., bonding with and thereby eliminating stray surface charge, is not achieved.

Also, the use of gas injector (11 or 11a) which transports hydrogen and nitrogen gases to the upper portion of the quartz tube increases the manufacturing cost of the furnace. The movement of the gas injector during maintenance operations on the quartz tube may produce particles from the tube which will ultimately contaminate the wafers and reduce yield of the semiconductor devices formed on the wafers. Finally, the elongated gas injector is maintenance intensive.

SUMMARY OF THE INVENTION

A vertical diffusion furnace according to the present invention overcomes the foregoing disadvantages.

To achieve these results, the present invention provides a vertical diffusion furnace adapted to receive a plurality of wafers and for use in semiconductor fabrication processes comprising; a quartz tube, and a gas inlet formed in the quartz tube proximate a lowermost wafer in the plurality of wafers, and providing reactive gases into the quartz tube. The gas inlet may be formed horizontally through the quartz tube beneath the lowermost wafer.

Additionally, the present invention may provide a gas outlet formed in the quartz tube, and the reactive gases typically comprise hydrogen and nitrogen.

In another aspect, the present invention provides a vertical diffusion furnace receiving a plurality of stacked wafers comprising; a quartz tube defining a interior reaction environment, a gas inlet formed horizontally through one side of the quartz tube at a position beneath the lowermost wafer, and adapted to provide a first stream of gas into the reaction environment, a gas injector injecting a second stream of gas into the reaction environment proximate the uppermost wafer, and a gas outlet discharging the gas from the quartz tube following reaction of the gas with the plurality of wafers.

BRIEF DESCRIPTION OF THE DRAWINGS

The above advantages of the present invention will become more apparent upon consideration of preferred embodiments of the present invention with reference to the attached drawings in which:

FIG. 2 shows a vertical diffusion furnace according to the present invention.

DETAILED DESCRIPTION OF THE INVENTION

Figure 1A:
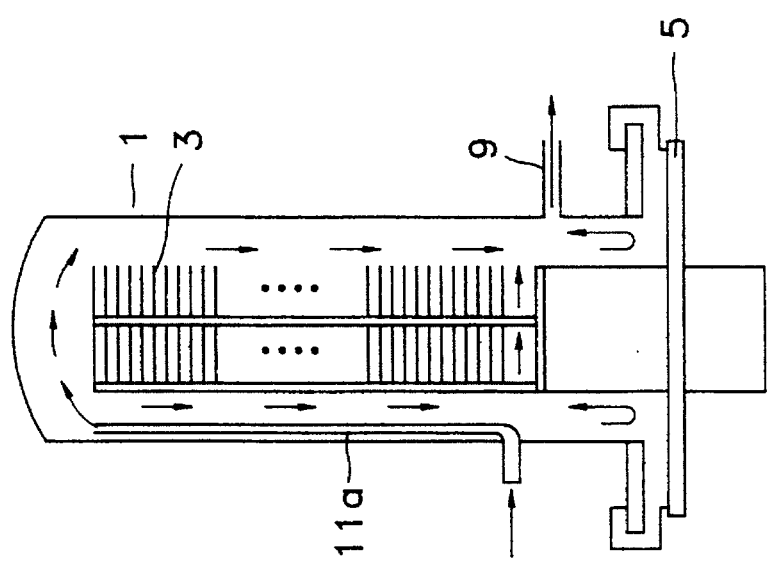
FIGS. 1A and 1B show conventional vertical diffusion furnaces.
Figure 1B:
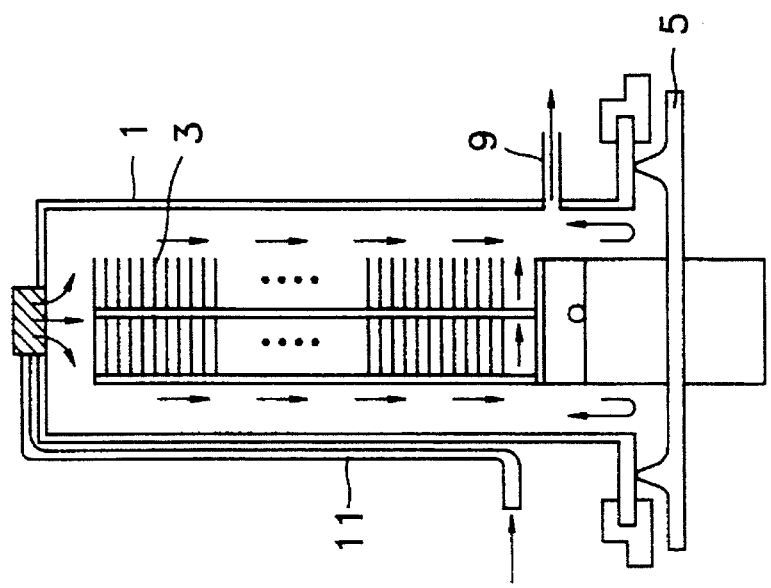
Figure 3:
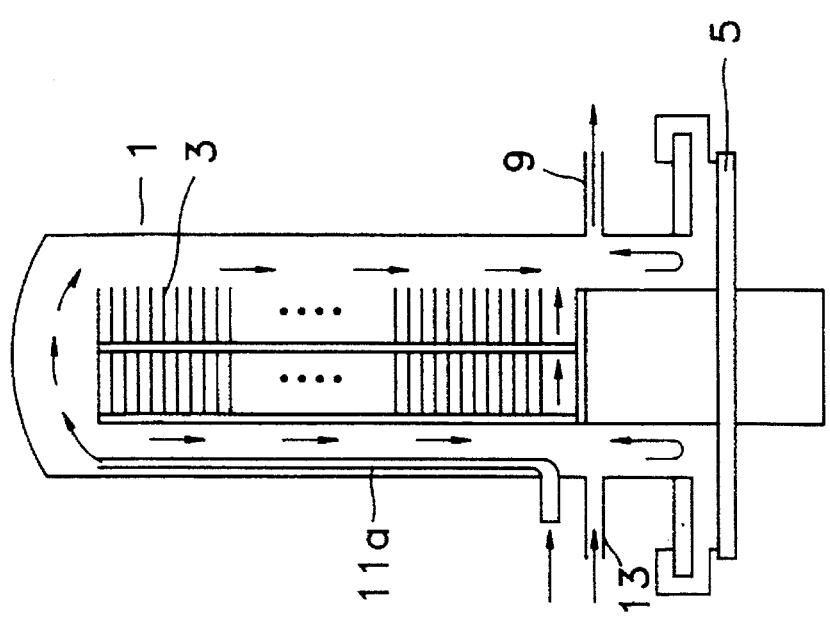
FIGS. 3 and 4 show a vertical diffusion furnace according to another embodiment of the present invention.
Figure 4:
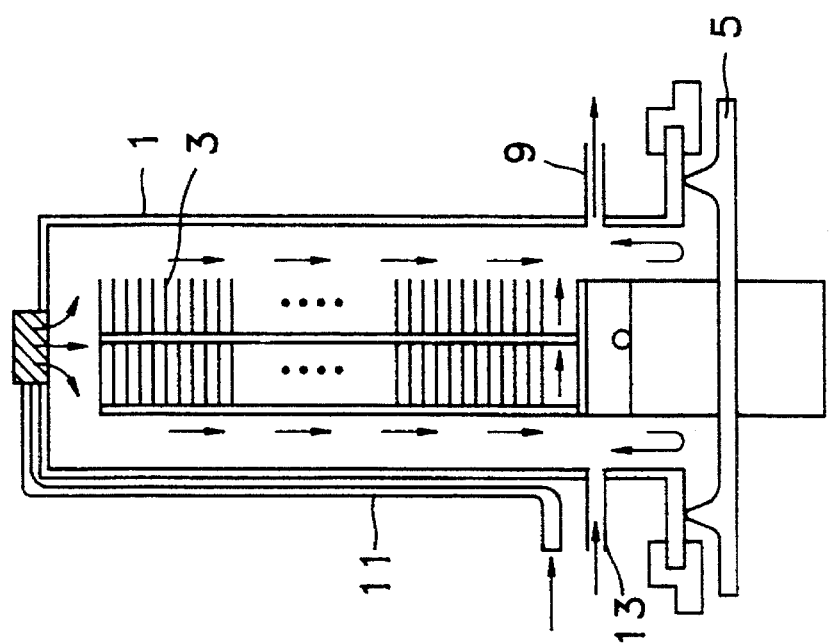

An exemplary embodiment of a vertical diffusion furnace according to the present invention is shown in FIG. 2. As can be seen in FIG. 2, the present invention, like the conventional vertical diffusion furnaces shown in FIGS. 1A and 1B, comprises; quartz tube 1, plurality of wafers 3 loaded therein, and gas outlet 9. However, the vertical diffusion furnace according to the present invention also comprises a gas injector 13 horizontally formed through the outer wall of quartz tube 1 such that the hydrogen gas is injected below the of a lowermost wafer within the quartz tube 1.

In contrast to the conventional vertical diffusion furnace, the vertical diffusion furnace according to the present invention provides hydrogen gas and nitrogen gas through a gas inlet 13 without the need for a separate connector. Hydrogen gas is lighter than nitrogen gas by a weight ratio of 1:7. Therefore, hydrogen gas will tend to flow upwards in quartz tube 1, and nitrogen gas will tend to flow downwards in quartz tube 1. The hydrogen gas will also tend to flow upwards as it expands during the rapid heating process experienced upon entry of the relatively low temperature gas into the high temperature furnace.

Since the resulting upward flow of hydrogen gas is against the force of gravity, the speed with which the gas flows is significantly less than the downward flow speed of the hydrogen gas in the conventional vertical diffusion furnace. As a result, the reaction occurring between the hydrogen gas and the wafers is enhanced as contact time between hydrogen ions and surface electrical charge is increased. In other words, rapid gas convection within quartz tube 1 is effectively suppressed, and a relatively stable gas layer is formed in the portion A of quartz tube 1 as indicated in FIG. 2.

Alloy processing for a batch of wafers ultimately fabricated into 16M DRAMs was performed in a vertical diffusion furnace having the foregoing structure. The process was performed for 40 minutes at 400° C. using a weight ratio of 1:0.33 for total gas mass to hydrogen gas. When compared to 16M DRAMs similarly fabricated, but for the use of the improved vertical diffusion furnace, the device yield increased by about 1%.

In another embodiment of the vertical diffusion furnace according to the present invention gas inlet 13 is added to the conventional vertical diffusion furnace structure having a gas injector (11 or 11a). Gas inlet 13 is horizontally formed through the outer wall of quartz tube 1 and positioned below the lowermost wafer. With this configuration, hydrogen gas is injected into quartz tube 1 through gas injector 11 and through gas inlet 13. Since gas is injected into the vertical diffusion furnace through different opposing injection means, gas convection within the quartz tube is reduced when compared to the case where hydrogen gas and nitrogen gas are both injected downwardly only through gas injector 11 or 11a.

The first embodiment entirely eliminates the gas injector (11 and 11a) and the associated connector. Thus, a vertical diffusion furnace constructed according to the present invention will be less expensive to make, and easier to maintain.

The second embodiment allows easy and economical adaptation of conventional vertical diffusion furnaces to the present invention. Both embodiments clearly illustrate the ability of the present invention to reduce the speed of convection flow within the quartz tube, and to thereby improve the desired reaction between injected hydrogen and the wafers.

The foregoing preferred embodiments have been given by way of example. The present invention is not limited to the preferred embodiments. It should be understood that various changes and modifications to the preferred embodiments described herein will be apparent to those skilled in the art. Such changes and modifications can be made without departing from the scope of the present invention as defined by the appended claims.

What is claimed is:

1. A vertical diffusion furnace comprising:

a quartz tube defining an interior reaction environment receiving a plurality of vertically stacked wafers;

a gas inlet formed in the quartz tube at a position beneath a lowermost wafer in the plurality of vertically stacked wafers, and adapted to provide a first stream of reactive gas from a reactive gas source into the interior reaction environment; and, a gas injector injecting a second stream of reactive gas from the reactive gas source into the interior reaction environment proximate an uppermost wafer in the plurality of vertically stacked wafers.

2. The vertical diffusion furnace of claim 1, further comprising a gas outlet formed in the quartz tube.

3. The vertical diffusion furnace of claim 2, wherein the gas inlet is formed horizontally through the quartz tube beneath the lowermost wafer.

4. A vertical diffusion furnace comprising:

a quartz tube defining an interior reaction environment receiving a plurality of vertically stacked wafers;

a gas inlet formed in the quartz tube at a position beneath the a lowermost wafer in the plurality of vertically stacked wafers, and adapted to provide a first stream of reactive gas from a reactive gas source into the interior reaction environment;

a gas injector injecting a second stream of reactive gas from the reactive gas source into the reaction environment proximate an uppermost wafer in the plurality of vertically stacked wafers; and a gas outlet discharging the gas from the quartz tube following reaction of the gas with the plurality of wafers.

5. The vertical diffusion furnace of claim 4, wherein the reactive gas comprises hydrogen.

* * * * *